United States Patent
Peeters et al.

(10) Patent No.: US 9,624,426 B2
(45) Date of Patent: Apr. 18, 2017

(54) LIGHT CONVERTER AND LIGHTING UNIT COMPRISING SUCH LIGHT CONVERTER

(75) Inventors: Martinus Petrus Joseph Peeters, Weert (NL); René Theodorus Wegh, Veldhoven (NL); Gerardus Wilhelmus Gerbe Van Dreumel, Nijmegen (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 147 days.

(21) Appl. No.: 14/236,091

(22) PCT Filed: Aug. 1, 2012

(86) PCT No.: PCT/IB2012/053930
§ 371 (c)(1),
(2), (4) Date: Jan. 30, 2014

(87) PCT Pub. No.: WO2013/018041
PCT Pub. Date: Feb. 7, 2013

(65) Prior Publication Data
US 2014/0168943 A1    Jun. 19, 2014

Related U.S. Application Data

(60) Provisional application No. 61/514,936, filed on Aug. 4, 2011.

(51) Int. Cl.
*F21V 1/00* (2006.01)
*C09K 11/67* (2006.01)
(Continued)

(52) U.S. Cl.
CPC .............. *C09K 11/67* (2013.01); *C09K 11/06* (2013.01); *C09K 11/7721* (2013.01);
(Continued)

(58) Field of Classification Search
CPC . C09K 11/06; C09K 11/7721; C09K 11/7734; C09K 11/7774; C09K 11/67; C09K 2211/1011; F21K 9/56; F21K 2/00
(Continued)

(56) References Cited

U.S. PATENT DOCUMENTS 7,078,732 B1 * 7/2006 Reeh .................. C09K 11/7718
257/89
2003/0184219 A1    10/2003 Duggal et al.
(Continued)

FOREIGN PATENT DOCUMENTS

EP      2065931 A1    6/2009
JP      10154830 A    6/1998
(Continued)

OTHER PUBLICATIONS

Jan Ziegleri et al; "Silica-Coated INP/ZNS Nanocrystals as Converter Material in White LEDs", Advanced Materials, Wiley VCH Verlag, DE, vol. 20, No. 21, Nov. 3, 2008, pp. 4068-4073, XP002637237.
(Continued)

*Primary Examiner* — Ali Alavi

(57) ABSTRACT

The invention provides a lighting unit having a light source, configured to generate light source light, and a light converter, configured remote of the light source and configured to convert at least part of the light source light into luminescent material light. The light converter includes (a) a yellow light emitting cerium containing garnet luminescent material, (b) a green light emitting luminescent material, (c) a red light emitting organic luminescent material, and (d) a particulate scattering material.

12 Claims, 3 Drawing Sheets

(51) Int. Cl.
*C09K 11/06* (2006.01)
*C09K 11/77* (2006.01)
*H01L 33/50* (2010.01)
*F21K 2/00* (2006.01)
*F21K 9/64* (2016.01)

(52) U.S. Cl.
CPC ...... *C09K 11/7734* (2013.01); *C09K 11/7774* (2013.01); *F21K 2/00* (2013.01); *F21K 9/64* (2016.08); *H01L 33/504* (2013.01); *H01L 33/507* (2013.01); *C09K 2211/1011* (2013.01)

(58) Field of Classification Search
USPC .................................................. 362/84, 351
See application file for complete search history.

(56) References Cited

U.S. PATENT DOCUMENTS

| | | | |
|---|---|---|---|
| 2006/0065907 A1 | 3/2006 | Lee et al. | |
| 2006/0220531 A1* | 10/2006 | Tokunaga | C09K 11/06 313/501 |
| 2006/0226759 A1* | 10/2006 | Masuda | C09K 11/0883 313/486 |
| 2007/0221938 A1* | 9/2007 | Radkov | C09K 11/7734 257/98 |
| 2009/0224177 A1* | 9/2009 | Kinomoto | C09K 11/7721 250/484.4 |
| 2009/0309116 A1* | 12/2009 | Kato | C09K 11/7721 257/98 |
| 2012/0119639 A1* | 5/2012 | Staats | C09K 11/06 313/485 |

FOREIGN PATENT DOCUMENTS

| | | |
|---|---|---|
| JP | 2003292758 A | 10/2003 |
| JP | 2006049799 A | 2/2006 |
| JP | 2006332269 A | 12/2006 |
| JP | 2007231245 A | 9/2007 |
| JP | 2008050379 A | 3/2008 |
| JP | 2009094207 A | 4/2009 |
| JP | 2010100743 A | 5/2010 |
| JP | 2010251621 A | 11/2010 |
| JP | 2011509427 A | 3/2011 |
| JP | 2011129661 A | 6/2011 |
| WO | 2004036961 A2 | 4/2004 |
| WO | 2007125493 A2 | 11/2007 |
| WO | 2010116294 A1 | 10/2010 |
| WO | WO2011020756 A1 | 2/2011 |

OTHER PUBLICATIONS

M. Kuera et al; "Growth and Properties of Epitaxial Ce-Doped Yag and LuAG Films for Scintillators", Journal of Physics: Conf. Series, Institute of Physics Publishing, Bristol, GB, vol. 249, No. 1, Nov. 22, 2010, pp. 12020, XP020200446.

* cited by examiner

LIGHT CONVERTER AND LIGHTING UNIT COMPRISING SUCH LIGHT CONVERTER

FIELD OF THE INVENTION

The invention relates to a light converter and lighting unit comprising such light converter.

BACKGROUND OF THE INVENTION

Lighting units comprising LED light sources and luminescent materials as light converters are known in the art.

WO0108452, for instance, describes a light source comprising a radiation source having an emission from 420 to 490 nm and a phosphor having a garnet structure as represented by $A_3B_5O_{12}$:Ce wherein A is terbium or terbium together with at least one of the elements Y, Gd, La, and/or Lu and B is at least one of the elements Al and Ga, the phosphor converting at least a part of the emission from the radiation source into a longer-wave radiation.

Further, WO2010116294 describes a luminescent converter for a phosphor-enhanced light source. The luminescent converter comprises a first luminescent material configured for absorbing at least a part of excitation light emitted by a light emitter of the phosphor-enhanced light source, and for converting at least a part of the absorbed excitation light into first emission light comprising a longer wavelength compared to the excitation light. The luminescent converter further comprises a second luminescent material comprising organic luminescent material and configured for absorbing at least a part of the first emission light emitted by the first luminescent material, and for converting at least a part of the absorbed first emission light into second emission light having a longer wavelength compared to the first emission light. An effect of the luminescent converter according to the invention is that the two-step light conversion according to the invention generates a relatively small Stokes shift of the light emitted by the organic luminescent material. The inventors have found that by reducing the Stokes shift of the organic luminescent material, the width of the spectrum of the second emission light is limited to reduce an infrared part in the emission spectrum. As such, the efficiency is improved.

SUMMARY OF THE INVENTION

A problem of prior art systems may be that the color rendering index (CRI) is often too low. For instance, the problem of combining $Y_3Al_5O_{12}$:$Ce^{3+}$, further called YAG, with organic red is that the CRI requirement is not met at all correlated color temperatures (CCT's) and blue bins. When for instance combining Lumogen F305 (from BASF) and $Y_3Al_5O_{12}$:$Ce^{3+}$, and using 447 nm LED excitation, at a CCT of 4000 K the CRI is limited to only 72, whereas market requirements dictate a CRI of minimum 80. The CRI could be increased by using a longer wavelength LED. For instance, when using the same system with 455 nm LED excitation, a CRI>80 can be obtained. A disadvantage however of higher wavelength blue LED's is their relatively lower efficiency. It would be desired to use a LED emitting at a shorter wavelength than 455 nm. Instead of red light emitting organic materials would be the use of red light emitting inorganic materials. A disadvantage may however be prices of such materials.

Hence, it is an aspect of the invention to provide an alternative light converter and/or lighting unit comprising such light converter, which preferably further at least partly obviate one or more of above-described drawbacks.

Surprisingly it appears that when a combination of (a) YAG:Ce (or small variations on the garnet material, see below), (b) a green light emitting material, (c) a red light emitting organic material and (d) a scattering material may provide a converter that is able to provide together with blue light, such as blue light in the range of 440-460 nm, especially 440-450 nm, light with a high CRI, equal to or higher than 80, or even equal to or higher than 85, or even of 90 or higher. Such combination can be used as light converter in a lighting unit, wherein the light converter converts at least part of light of a light source of such lighting unit.

It surprisingly appears that very high CRI's (e.g. >90) can be obtained, by the addition of LuAG to YAG, at a very limited efficiency penalty. For example, CRI can be increased from <80 to 90+ for a 450 nm blue LED (or longer) system by the replacement of 40% of YAG by LuAG at an efficiency penalty of only 2-3%. However, also other green emitters, other than LuAG, can be used (see below).

It further appears that with red light emitting inorganic luminescent materials such high CRI light and/or such efficient systems cannot be obtained. The use of a red luminescent material with a small stokes shift, as is often the case for organic material, surprisingly seems to enable a big CRI increase by the addition of a green phosphor to a (yellow+red) phosphor system. For inorganic red phosphors (large stokes shift) this does not appear to provide good systems, as most of the green light might get reabsorbed by the red inorganic phosphor, thereby limiting the possibilities to close the "cyan-gap" which is needed to obtain high a CRI. Most inorganic red phosphors currently used in LEDs exhibit a large stokes shift, like divalent europium containing calcium silicon nitrides, like divalent europium containing alkaline earth sulfides and quantum dots. Hence, it surprisingly appears that the best choice is an organic luminescent material as red emitting luminescent material.

It further appears that the presence of the scattering material is beneficial. When scattering material is present, it seems to minimize the effect that the light emitted by the green phosphor is absorbed by the yellow phosphor; in other words it maximizes the effect on white emission spectrum, and therefore CRI, when replacing only a small amount of yellow phosphor by green phosphor. This is beneficial since the green phosphor is often more expensive than the yellow phosphor. Hence, it appears that the combination of at least the above mentioned four compounds may lead to light converter that can efficiently employed in a lighting unit with a blue light emitting light source to provide white light with a high CRI.

Therefore, in a first aspect the invention provides a lighting unit comprising a light source, configured to generate light source light, and a light converter, configured remote of the light source and configured to convert at least part of the light source light into luminescent material light, wherein the light converter comprises (a) a yellow light emitting cerium containing garnet luminescent material, (b) a green light emitting luminescent material, (c) a red light emitting organic luminescent material, and (d) a particulate scattering material. With this combination of light source and light converter, with a high efficiency white light with a good color rendering may be obtained. Especially, the CRI may be equal to or over 80, such as at least 85, especially at least 90. Hence, the lighting unit may be configured to provide lighting unit light downstream of the light converter, wherein the lighting unit light has a CRI of at least 90.

Herein, the term "lighting unit light" refers to the light downstream of the light converter, which light may consists of luminescent material light (of the luminescent materials) and remaining light source light. The term "luminescent material" may also relate to a combination of luminescent materials. The light converter comprises at least three different luminescent materials, but may optionally comprise further luminescent materials. The term "light converter" may include a single entity comprising all the indicated materials, but may also refer to different entities, together comprising all the indicated materials. See further also below. The term "green light emitting luminescent material" and similar terms indicate that under excitation with light of an appropriate wavelength (especially in the blue range; see below), the luminescent material is excited and will emit luminescence of the indicated color.

The light source is especially configured to provide blue light source light, such as in the range of 410-490 nm, but especially in the range of 440-460 nm. The term "light source" may refer to a plurality of light sources. In a specific embodiment, the light source comprises a light emitting diode (LED), more especially a light emitting diode (LED) configured to generate blue light. Downstream of the light source, the light converter is arranged. The light converter is arranged at a distance from the light source. Assuming an LED, the light converter is not in physical contact with LED, or more precisely, not in physical contact with the LED die. The light converter is thus arranged remote from the light source. Especially, the light converter is transmissive for light source light. In this way, the converter can be used as exit window or as exit window coating on an exit window or as layer to an exit window of the lighting unit (see also below). In yet another embodiment, the light converter is not transmissive for light source light. Substantially all light may be absorbed, and part of the absorbed light may be emitted as lighting unit light from the light converter (exit window). This may be of interest when desiring low CCT lighting units and/or when using a UV light source.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

In an embodiment, the yellow light emitting cerium containing garnet luminescent material comprises an $A_3B_5O_{12}:Ce^{3-}$ garnet, wherein A comprises yttrium and optionally one or more of lutetium, gadolinium, terbium and lanthanum, and wherein B comprises aluminum and optionally gallium. In an embodiment, the green light emitting luminescent material comprises an $A_3B_5O_{12}:Ce^{3-}$ garnet, wherein A comprises lutetium and optionally one or more of yttrium, gadolinium, terbium and lanthanum, and wherein B comprises aluminum and optionally gallium. Herein the phrase "wherein A comprises lutetium and optionally one or more of yttrium, gadolinium, terbium and lanthanum" and similar phrases include for instance embodiments like $Y_3Al_5O_{12}:Ce^{3+}$, $Y_2LuAl_5O_{12}:Ce^{3-}$, $YGdTbAl_5O_{12}:Ce^{3+}$, $Y_{2.5}Lu_{0.5}Al_5O_{12}:Ce^{3+}$, etc. Similarly this may be applied to the (partial) substitution of Al with Ga and/or other elements.

Hence, the yellow emitting luminescent material comprises a garnet material with at least yttrium at the A cation positions, whereas the green light emitting luminescent material comprises a garnet material with at least lutetium at the A cation positions. By choosing the (relative amount of) A cations and/or by choosing the (relative amount of) B cations, and even by choosing the amount of Ce, the emission band may shift. The yellow light emitting luminescent material is especially configured to generate yellow light and the green light emitting luminescent material is especially configured to generate green light. Examples of yellow and green emitting garnets are respectively $Y_3Al_5O_{12}:Ce^{3+}$ (herein also indicated as YAG), and $Lu_3Al_5O_{12}:Ce^{3+}$ (herein also indicated as LuAG), respectively.

Embodiments of garnets especially include $A_3B_5O_{12}$ garnets, wherein A comprises yttrium and/or lutetium, and optionally one or more of gadolinium, terbium and lanthanum, and wherein B comprises preferably aluminum. Such garnet may be doped with cerium (Ce) or a combination of cerium and praseodymium; especially however with Ce.

Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A.

The terms ":Ce" or ":Ce$^{3+}$" indicate that part of the metal ions (i.e. in the garnets: part of the "A" ions) in the luminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace A in general for not more than 10%; in general, the Ce concentration will be in the range of 0.1-4%, especially 1.5-4% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. Likewise this may apply to the notation of ":Eu" or ":Eu$^{2+}$", see below. Hence, the term "cerium containing" and similar terms indicate that the luminescent material comprises cerium, which is present as luminescent species in the luminescent material.

Preferably, the yellow light emitting luminescent material comprises $Y_3Al_5O_{12}:Ce^{3+}$, with only small variation on Y and/or Al, such as less than 10 mol % of Y has been replaced with one or more of above the indicated lanthanides and/or less than 10 mol % of Al has been replaced with one or more of the above indicated possible substituent, such as Ga. Likewise, preferably the green light emitting luminescent material comprises $Lu_3Al_5O_{12}:Ce^{3+}$, with only small variation on Lu and/or Al, such as less than 10 mol % of Lu has been replaced with one or more of above the indicated lanthanides (including yttrium) and/or less than 10 mol % of Al has been replaced with one or more of the above indicated possible substituent, such as Ga.

However, in addition to this green luminescent material and/or in addition to this yellow luminescent material also one or more other luminescent materials may be applied. Hence, adding LuAG is one method to increase the CRI of a (inorganic yellow+organic red) phosphor system. Any other method to reduce the cyan gap may work as well, with minimum loss of efficiency, as long as the red phosphor has a small Stokes shift (see also below). For instance, the YAG spectrum can be shifted to shorter wavelength by decreasing the Ce concentration, or by substituting Al for Ga, or a completely other type of luminescent material may be added. Hence, in an embodiment, next to $Y_3Al_5O_{12}:Ce^{3+}$, as yellow emitter, $Y_3Al_4GaO_{12}:Ce^{3+}$ may be applied.

In an embodiment, the green light emitting luminescent material comprises one or more luminescent materials selected from the group consisting of $(Sr,Ba,Ca)_2SiO_4:Eu^{2+}$, and $(Sr,Ca,Ba)Si_2O_2N_2:Eu^{2+}$. In an embodiment, as green luminescent material $(Sr_{2-x-y-a}Ba_xCa_y)SiO_4:Eu_a^{2+}$, wherein $0 \le x \le 2$, $0 \le y \le 2$, $0 < (x+y+a) \le 2$, $0 < a \le 0.4$ is applied. In another embodiment, alternatively or additionally $(Sr_{1-a-b-c}Ca_bBa_c)Si_2N_2O_2:Eu_a^{2+}$ wherein $0 < a \le 0.25$, $0 \le b \le 1$, $0 \le c \le 1$, $0 < (a+b+c) \le 1$, is applied as green luminescent material. In yet another embodiment, which may optionally also be combined with the previous embodiment, the green light emitting luminescent material comprises one or more luminescent materials selected from the group of (green light emitting) thiogallates. Hence, in an embodiment, the luminescent material comprises $(Mg,Ca,Sr,Ba)Ga_2S_4:Eu^{2+}$, especially $(Ca,Sr,Ba)Ga_2S_4:Eu^{2+}$.

The red light emitting organic luminescent material may especially comprise a red light emitting perylene material. An example of such system is Lumogen F305 (from BASF). An advantage of organic red light emitting luminescent materials may be their small stokes shift. In this way, the absorption in the green may be relatively low, and thus the possible absorption of the green light from the green light emitting luminescent material, which may especially be applied to reduce the "cyan gap", is limited. Especially, an organic red light emitting luminescent material is chosen of which the Stokes shift, determined as top-top distance is in the range of at maximum about 150 nm, such as in the range of 25-150 nm. Here the distance (in nanometers) between the top of the lowest excitation band (lowest in energy) and the top of the corresponding highest emission band (highest in energy) is taken. Lumogen F305, for instance, has a Stokes shift in the range of about 50 nm. Therefore, the red light emitting organic luminescent material may especially have a Stokes shift of 150 nm or smaller, especially of 100 nm or smaller, such as for instance perylene red, such as perylene red F305 (from BASF).

Hence, in a specific embodiment, the yellow light emitting cerium containing garnet luminescent material comprises $Y_3Al_5O_{12}:Ce^{3+}$, the green light emitting luminescent material comprises $(Y,Lu)_3Al_5O_{12}:Ce^{3+}$ with at least lutetium, and especially $Lu_3Al_5O_{12}:Ce^{3+}$, and the red light emitting organic luminescent material comprises a red light emitting organic luminescent material having a Stokes shift of 150 nm or smaller, especially of 100 nm or smaller, such as for instance perylene red F305.

Especially advantageous appears to be embedding the organic luminescent material in a matrix, especially a polymeric matrix. Such polymeric matrix may especially be transmissive, preferably transparent. Hence, in a preferred embodiment the red light emitting organic luminescent material is embedded in a polymer matrix. Especially, the polymer matrix comprises one or more materials selected from the group consisting of PE (polyethylene), PP (polypropylene), PEN (polyethylene napthalate), PC (polycarbonate), polymethylacrylate (PMA), polymethylmethacrylate (PMMA) (PLEXIGLASS® or PERSPEX®), cellulose acetate butyrate (CAB), polyvinylchloride (PVC), polyethyleneterephthalate (PET), (PETG) (glycol modified polyethyleneterephthalate), PDMS (polydimethylsiloxane), silicone, and COC (cyclo olefin copolymer). It appears that especially a combination of (a) YAG:Ce (or small variations on the garnet material, see below), (b) a green emitting material, (c) a red light emitting organic material embedded in a polymer matrix and (d) a scattering material may provide a converter that is able to provide together with blue light, such as blue light in the range of 440-460 nm, especially 440-450 nm, light with a high CRI, higher than 80, or even higher than 85, or even of 90 or higher, with a long time stability.

As indicated above, the light converter further includes a particulate scattering material. Herein, the term particulate scattering material especially may refer to crystalline particles of inorganic salts or polymeric particles. The particulate scattering material may be white (i.e. high reflectance in the visible part of the spectrum). In another embodiment, the particulate scattering material is transparent. Especially, the index of refraction of the particulate scattering is larger or smaller than of the matrix in which it is embedded, especially larger or smaller than the polymeric matrix, especially at least 0.1 larger or smaller than the polymer matrix. In an embodiment, the particulate scattering material comprises one or more materials selected from the group consisting of $TiO_2$, $BaSO_4$, $Al_2O_3$, $SiO_2$, $ZnO$, $MgO$, magnesium silicate, $Sb_2O_3$, $CaCO_3$, and white lead, especially one or more of $TiO_2$, $BaSO_4$, $Al_2O_3$, $ZnO$, and $MgO$. Magnesium silicate is also known as talc and may be described as $Mg_3Si_4O_{10}(OH)_2$. White lead may be described as $(PbCO_3)_2 \cdot Pb(OH)_2$. Preferably, the particulate scattering material comprises (crystalline) particles having particle sizes in the range of 0.05-100 µm, such as 0.1-50 µm. Further, especially, the particulate scattering material is present in an amount in the range 0.1-25 wt. % relative to the total weight of the luminescent materials and particulate scattering material.

The light converter may be arranged in all kind of arrangements. Whatever arrangement is chosen, the light converter is configured to convert at least part of the light source light and the light source is configured to illuminate at least part of the light converter. Especially, the light source may be configured to generate blue light source light. Hence, in such embodiment, the light converter is configured to convert part of the light source light into luminescent material light and to provide, together with the light source light, lighting unit light. Therefore, in such embodiments, the lighting unit light may consist of light source light and luminescent material light (i.e. converted light source light). The light converter may comprise a layer or a plurality of layers. When using a plurality of layers, the luminescent materials may be distributed evenly or unevenly over the layers. In an embodiment, the light converter may be a layer on a exit window or may be part of a exit window of the lighting unit. Light generated in the lighting unit may escape through the exit window. In yet another embodiment, part of the luminescent material is contained in a exit window and part is applied as layer to the exit window, such as a coating. Hence, as will be clear to a person skilled in the art, different types of configurations may be applied.

In a specific embodiment, the light converter comprises a layered structure comprising a plurality of layers. Here, the term "layered structure" or "multi-layer structure" indicates two or more layers on top of each other. In an embodiment, the layered structure comprises a first layer comprising the red light emitting organic luminescent material and optionally part of the particulate scattering material, and a second layer comprising the yellow light emitting cerium containing garnet luminescent material and the green light emitting luminescent material and at least part of the particulate scattering material. In such configuration, the red light emitting luminescent material may be arranged more remote from the light source than the other luminescent materials. Hence, in an embodiment, relative to the light source, the first layer is configured downstream of the second layer (and thus the second layer is upstream of the first layer). In yet another embodiment, the red light emitting luminescent material(s) is arranged upstream of the other luminescent materials.

Further, in an embodiment the light source and the light converter are configured in a light chamber. In this light chamber, the light source is arranged and the light converter may be arranged in the light chamber, but may in an embodiment also be partly or completely an exit window of the light chamber. For instance, the exit window may comprise a polymer material, such as indicated above, containing the red light emitting organic luminescent material, and optionally some particulate scattering material, and the other luminescent materials and the scattering material may be configured as upstream coating to the exit window (thus at the light source side of the exit window). As indicated above, the light converter is configured at a non-zero distance of the light source. In further embodiments, the light converter may be part of an exit window, may be applied to (the light source surface side of the exit window), or may be the exit window itself of the light chamber.

In a further aspect, the invention also relates to the light converter per se. Hence, in an embodiment, the invention also provides a light converter configured to convert at least part of light source light into luminescent material light, wherein the light converter comprises (a) a yellow light emitting cerium containing garnet luminescent material, (b) a green light emitting luminescent material, (c) a red light emitting organic luminescent material, and (d) a particulate scattering material. Such light converter may for instance be a layered structure.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The terms "visible" light or "visible emission" refer to light having a wavelength in the range of about 380-750 nm.

These terms do not exclude that especially the luminescent material may have a broad band emission having emission with wavelength(s) outside the range of for instance about 490-560 nm, about 560-590 nm, and about 590-650 nm respectively. However, the dominant wavelength of emissions of such luminescent materials (or of the LED, respectively) will be found within the herein given ranges, respectively. Hence, the phrase "with a wavelength in the range of" especially indicates that the emission may have a dominant emission wavelength within the specified range.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
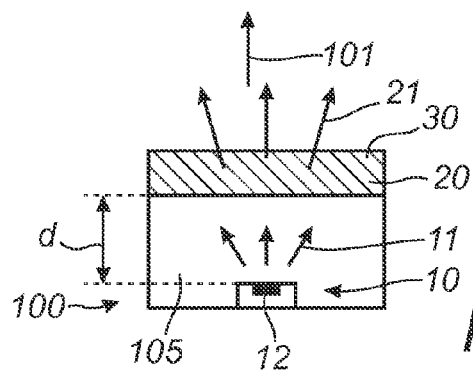
FIGS. 1a-1e schematically depict some aspects of the invention; the drawings are not necessarily on scale.

FIG. 1a schematically depicts an embodiment of a lighting unit 100 as described herein. The lighting unit 100 comprises a light source 10 configured to generate light source light 11. The lighting unit 100 further comprises a light converter 20 configured remote of the light source 11 and configured to convert at least part of the light source light 11 into luminescent material light 21. As will be further elucidated below, the light converter 20 comprises (a) a yellow light emitting cerium containing garnet luminescent material, (b) a green light emitting luminescent material, (c) a red light emitting organic luminescent material, and (d) a particulate scattering material.

Here, in this embodiment, the light converter 20 is transmissive for at least part of the light source light 11. The lighting unit 100 is especially configured to provide lighting unit light 101 downstream of the light converter 20. This lighting unit light may consist of for instance blue light source light 11 and green luminescence, yellow luminescence and red luminescence of the luminescent material, i.e. luminescent material light 21. Together, white lighting unit light 101 with a high CRI may be obtained.

In this embodiment, the light converter 20 has the function of exit window or is part of the exit window or integrated in the exit window. The exit window is indicated with reference 30. The light source light 11 is generated upstream of the exit window, and the lighting unit light 101 escapes from the exit window and is observed downstream of the exit window 30 (downstream of the light converter 20). Especially, the light source 10 may comprise a light emitting diode LED configured to generate blue light. The green and yellow light emitting luminescent materials may especially be configured to absorb the blue light of the light source 11; the red light emitting luminescent material may especially be configured to absorb blue light and/or yellow light. Preferably, its excitation maximum is in the yellow part of the visible spectrum or even the orange part of the visible spectrum.

The exit window 30 may for instance comprise one or more materials selected from the group consisting of PE (polyethylene), PP (polypropylene), PEN (polyethylene napthalate), PC (polycarbonate), polymethylacrylate (PMA), polymethylmethacrylate (PMMA) (PLEXIGLASS® or PERSPEX®), cellulose acetate butyrate (CAB), polyvinylchloride (PVC), polyethyleneterephthalate (PET), (PETG) (glycol modified polyethyleneterephthalate), PDMS (polydimethylsiloxane), silicone, and COC (cyclo olefin copolymer). These materials may be used to provide light transmissive exit windows.

In this schematically depicted embodiment, the light source 10 is configured in a light chamber 105. The light converter 20 may in this embodiment be considered as part of the walls of the light chamber 105, as it is part of the exit window 30, or integrated in the exit window 30 or is the exit window 30 itself. The light converter 20 is configured at a non-zero distance d of the light source 10. Here, distance d indicates the distance between the LED die, indicated with reference 12, and the light converter 20.

Figure 1B:
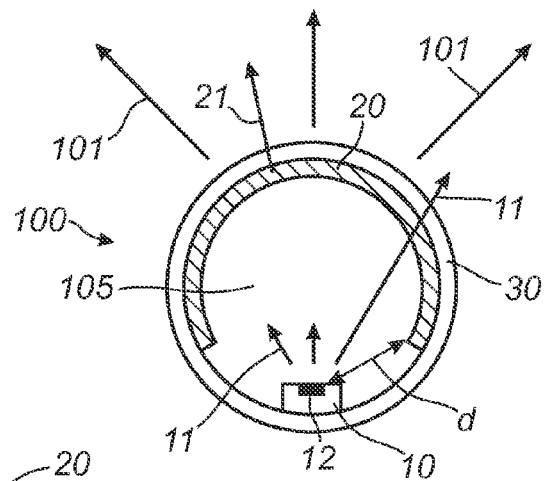

FIG. 1b schematically depicts a similar embodiment, but now a substantially round light chamber 105 is applied. Here, the light converter 20 is applied to a part of the inner face of the wall of the lighting unit 100. The wall is in fact the exit window 30 of the lighting device 100. Hence, the light converter 20 is applied to a part of the exit window 30 of the lighting device 100. For instance, such lighting unit 100 may be applied as replacement of conventional tubular low pressure fluorescent lamps (further called TLED).

Figure 1C:
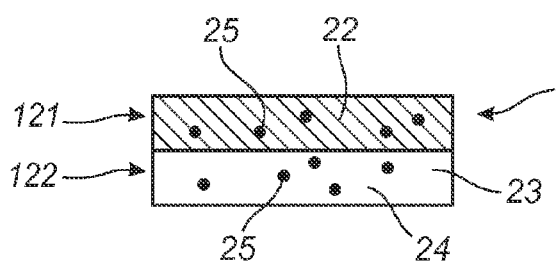
Figure 1D:
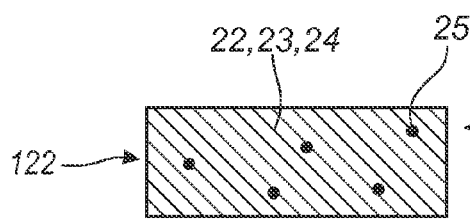
Figure 1E:
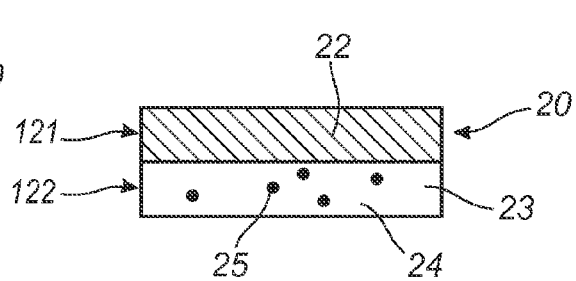

FIGS. 1c-1d schematically depict a non-limiting number of embodiments of the light converter 20. FIGS. 1c and 1e schematically depict embodiments where the light converter 20 comprises a layered structure comprising a plurality of layers 121,122, with reference 121 indicated a first layer and reference 122 indicating a second layer, wherein the first layer 121 comprises the red light emitting organic luminescent material 22 and optionally part of the particulate scattering material 25 (in 1c the first layer does comprise particulate scattering material 25; in FIG. 1e the first layer does not comprise particulate scattering material 25), and wherein the second layer comprises the yellow light emitting cerium containing garnet luminescent material 23 and the green light emitting luminescent material 24 and at least part of the particulate scattering material 25.

Schematic FIGS. 1c and 1e only show two layers. However, the light converter 20 may comprise further layers.

FIG. 1d schematically depicts an embodiment of the light converter 20 as single unit, comprising all indicated elements.

EXAMPLES

Embodiment 1

YAG/LuAG Coated onto Polymer Film Containing Lumogen F305

In a remote phosphor TLED a polymer film (PET) containing Lumogen F305 was used. On the foil a coating containing the inorganic garnet phosphor was applied by roll-to-roll coating. When used in combination with short wavelength LEDs (440-450 nm) replacement of ~20 wt. % of the YAG by LuAG resulted in lamps with a CRI>80 (without LuAG the CRI was lower than 80). An additional advantage of the addition of the mixing of LuAG and YAG is the reduced shift of the color point with wavelength of the blue LED.

Embodiment 2

YAG/LuAG/F305 in Polymer Film

Instead of coating the inorganic phosphors onto the polymer film, the phosphor was incorporated in the polymer using for example a film extrusion process.

Embodiment 3

CRI 90 Lamp

A coating of YAG and LuAG (approximately 20 wt. % LuAG, depending on the peak wavelength of the blue LEDs used) was applied onto a PET polymer film containing F305, in which the yellow/green layer and red layer thickness were chosen such, that 2700K light will be generated, which resulted in white light with a CRI of 90 (for any LED wavelength in between 440 and 460 nm).

Embodiment 4

Comparison Inorganic/Organic

The combination of YAG with F305 does not always lead to the required CRI (CRI>80 for cool white systems like e.g. TLED). Surprisingly, it was found that the replacement of a small fraction of the YAG (in a combination of YAG and F305) with LuAG leads to a big CRI increase and a very small drop in efficiency. For instance, at 4000 K the CRI can be increased from 80 to 90 by substituting only 30% of YAG by LuAG, while the efficiency decreases only 2%. This strong increase of the CRI can also be obtained for an inorganic yellow/green/red mixture, but more yellow needs to be substituted by green, and the efficiency decreases much more. For instance, at 4000 K the CRI for a YAG/CaAlSiN$_3$: Eu$^{2+}$ system can be increased from 80 to 90 by substituting all the YAG by LuAG, while the efficiency decreases 13%.

Embodiment 5

Influence Scattering Material

Figure 2A:
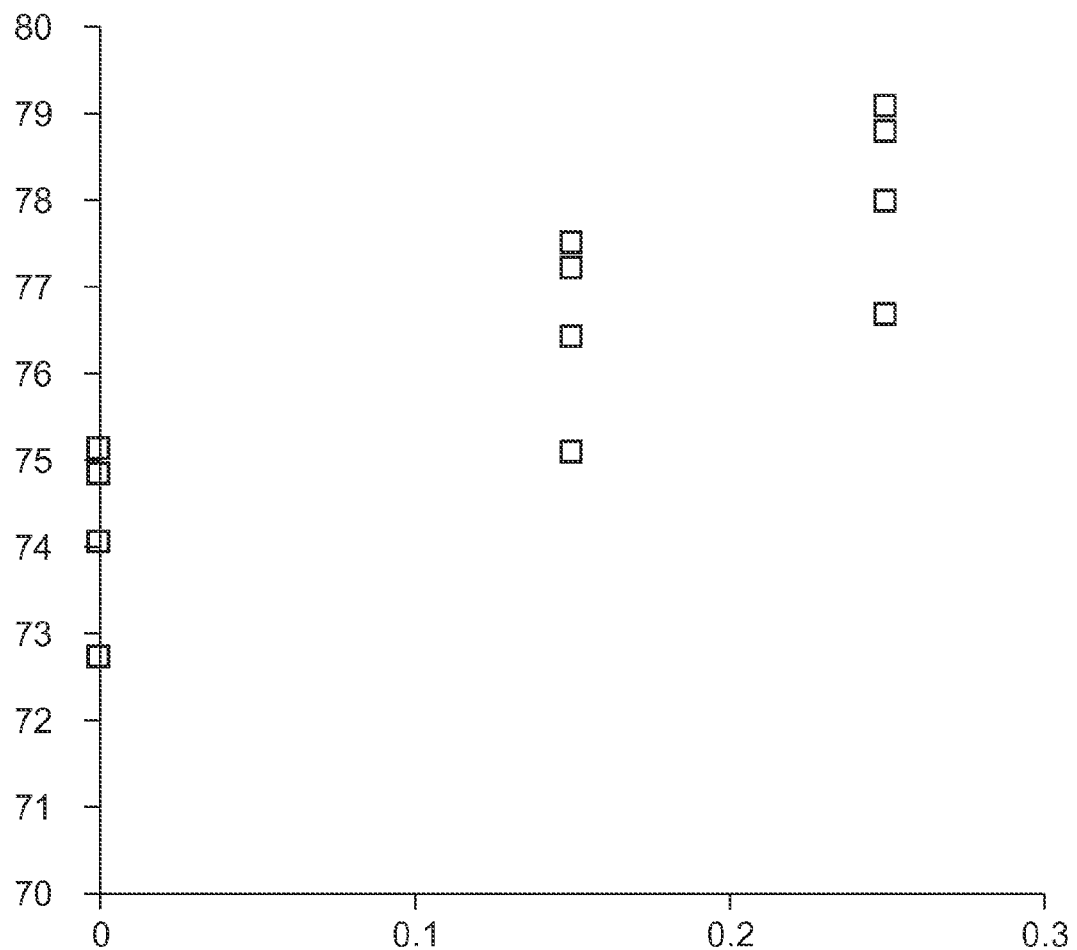
FIGS. 2a-2c show some data of aspects and/or some more specific embodiments of the invention.

FIG. 2a shows some factors influencing the CRI of a not yet optimized system. On the x-axis, the fraction of LuAG to YAG is shown. For instance, 0.3 indicated 70 wt. % YAG and 30 wt. % LuAG relative to the total amount of YAG+LuAG. On the y-axis, the CRI is indicated (at 4000K CCT). The 4 squares at any LuAG weight fraction indicate from bottom to top 0, 0.5, 1 and 1.5 g/m$^2$ TiO$_2$ in a layer comprising all luminescent materials. Hence, a substantial CRI increase can be obtained when incorporating the particulate scattering material.

Embodiment 6

Spectra

Figure 2B:
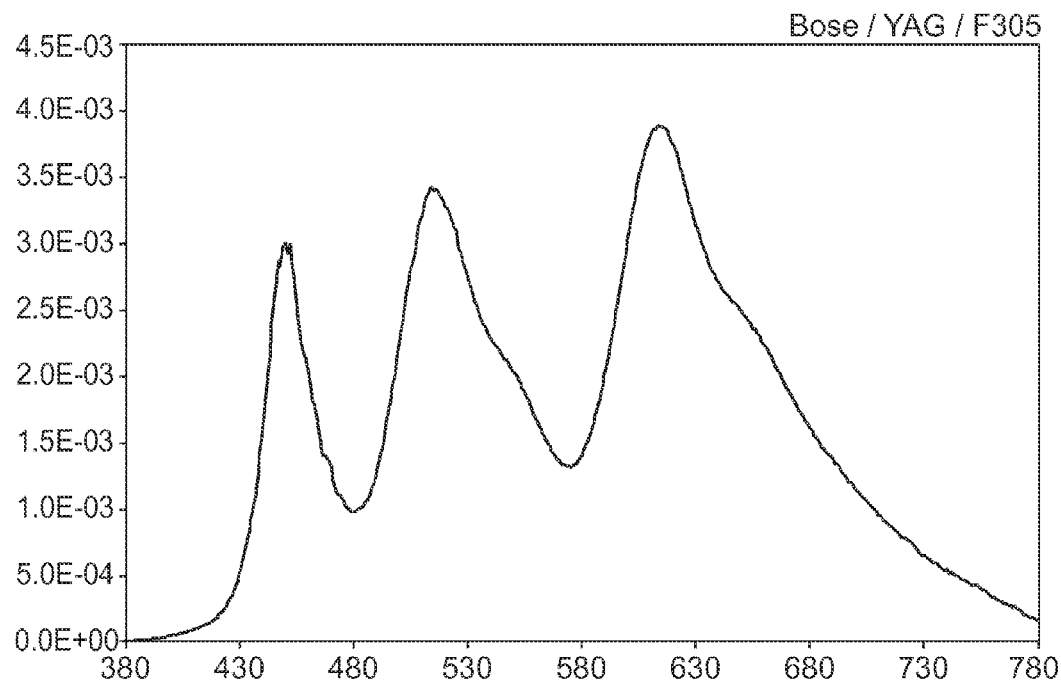
Figure 2C:
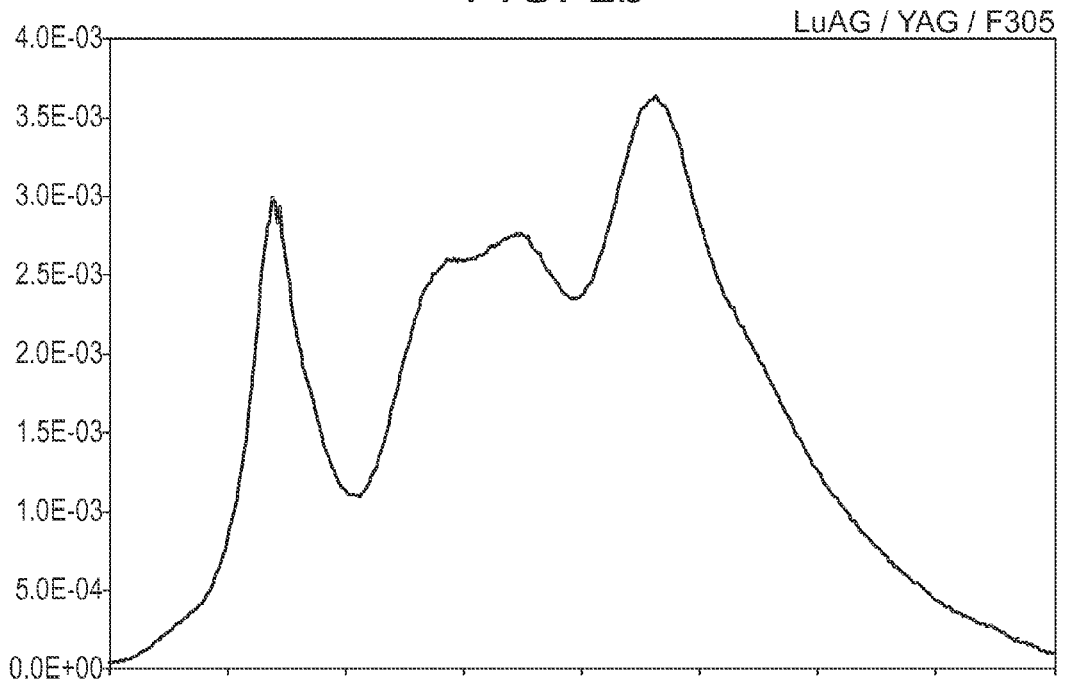

FIGS. 2b and 2c schematically depict two possible embodiments of luminescence spectra upon blue excitation. FIG. 2b depicts the combination of (Sr,Ba)SiO$_4$:Eu$^{2+}$, YAG and F305 and FIG. 2c depicts the combination of YAG, LuAG and F305. Both spectra give 4000 K white light, the spectrum in FIG. 2b with CRI 91, the spectrum in FIG. 2c with CRI 84.

The invention claimed is:

1. A lighting unit comprising:
a wall defining a light chamber of the lighting unit;
a light source configured in the light chamber and configured to generate light source light; and
a light converter, disposed remotely of the light source and coated on an inner face of the wall, the light converter being configured to convert at least part of the light source light into luminescent material light having a color rendering index (CRI), wherein the light converter comprises a yellow light emitting cerium containing garnet luminescent material, a green light emitting luminescent material, a red light emitting organic luminescent material, and a particulate scattering material;
wherein the yellow light emitting cerium containing garnet luminescent material comprises Y$_3$Al$_5$O$_{12}$:Ce$^{3+}$, wherein the green light emitting luminescent material comprises Lu$_3$Al$_5$O$_{12}$:Ce$^{3+}$ (LuAG) and Y$_3$Al$_5$O$_{12}$:Ce$^{3+}$ (YAG), with at least 20 wt. % of the YAG being replaced by the LuAG such that the CRI is greater than 80, and wherein the red light emitting organic luminescent material comprises perylene red.

2. The lighting unit according to claim 1, configured to provide lighting unit light downstream of the light converter, wherein the lighting unit light has a CRI of at least 80.

3. The lighting unit according to claim 1, wherein the light converter is transmissive for at least part of the light source light.

4. The lighting unit according to claim 1, wherein the red light emitting organic luminescent material is embedded in a polymer matrix.

5. The lighting unit according to claim 4, wherein the polymer matrix comprises one or more materials selected from the group consisting of polyethylene (PE), polypropylene (PP), polyethylene napthalate (PEN), polycarbonate (PC), polymethylacrylate (PMA), polymethylmethacrylate (PMMA), cellulose acetate butyrate (CAB), polyvinylchloride (PVC), polyethyleneterephthalate (PET), glycol modified polyethyleneterephthalate (PETG), polydimethylsiloxane (PDMS), silicone, and cyclo olefin copolymer (COC).

6. The lighting unit according to claim 1, wherein the red light emitting organic luminescent material comprises a red light emitting perylene material.

7. The lighting unit according to claim 1, wherein the Lu$_3$Al$_5$O$_{12}$:Ce$^{3+}$ is present in the green light emitting luminescent material in an amount in the range of 20-40 wt % relative to the total weight of the Lu$_3$Al$_5$O$_{12}$:Ce$^{3+}$ and the Y$_3$Al$_5$O$_{12}$:Ce$^{3+}$.

8. The lighting unit according to claim 1, wherein the light source comprises a light emitting diode (LED) configured to generate blue light.

9. The lighting unit according to claim 1, wherein the particulate scattering material comprises one or more materials selected from the group consisting of TiO$_2$, BaSO$_4$, Al$_2$O$_3$, SiO$_2$, ZnO, MgO, magnesium silicate, Sb$_2$O$_3$, CaCO$_3$, polymeric particles such as polysiloxane, and white lead, wherein the particulate scattering material comprises particles having particle sizes in the range of 0.05-100 μm, and wherein the particulate scattering material is present in an amount in the range 0.1-25 wt. % relative to the total weight of the luminescent materials and particulate scattering material.

10. The lighting unit according to claim 1, wherein the light converter comprises a layered structure comprising a plurality of layers, wherein a first layer comprises the red light emitting organic luminescent material and optionally part of the particulate scattering material, and wherein the second layer comprises the yellow light emitting cerium containing garnet luminescent material and the green light emitting luminescent material and at least part of the particulate scattering material.

11. A light converter coated on a wall of a lighting unit that defines a lighting chamber, the light converter being configured to convert at least part of light source light into luminescent material light having a color rendering index (CRI), wherein the light converter comprises a yellow light emitting cerium containing garnet luminescent material, a green light emitting luminescent material, a red light emitting organic luminescent material, and a particulate scattering material; and further wherein the light converter comprises a layered structure comprising a plurality of layers, wherein a first layer comprises the red light emitting organic luminescent material, and wherein the second layer comprises the yellow light emitting cerium containing garnet luminescent material and the green light emitting luminescent material, wherein one of the first layer or the second layer comprises the particulate scattering material, wherein the green light emitting luminescent material comprises Lu$_3$Al$_5$O$_{12}$:Ce$^{3+}$ (LuAG) and Y$_3$Al$_5$O$_{12}$:Ce$^{3+}$ (YAG), with at least 20 wt. % of the YAG being replaced by the LuAG such that the CRI is greater than 80.

12. The light converter according to claim 11, wherein the yellow light emitting cerium containing garnet luminescent material comprises Y$_3$Al$_5$O$_{12}$:Ce$^{3+}$, and wherein the red light emitting organic luminescent material comprises perylene red.

* * * * *